(12) United States Patent
Yamazaki

(10) Patent No.: US 6,597,245 B2
(45) Date of Patent: Jul. 22, 2003

(54) PREAMPLIFIER

(75) Inventor: Daisuke Yamazaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/234,872

(22) Filed: Sep. 4, 2002

(65) Prior Publication Data

US 2003/0016085 A1 Jan. 23, 2003

Related U.S. Application Data

(63) Continuation of application No. PCT/JP00/01358, filed on Mar. 6, 2000.

(51) Int. Cl.[7] .................................................. H03F 3/08
(52) U.S. Cl. ............ 330/308; 250/214 A; 250/214 AG; 330/279; 330/110
(58) Field of Search .................. 330/110, 279, 330/308; 250/214 A, 214 AG

(56) References Cited

U.S. PATENT DOCUMENTS 4,714,828 A 12/1987 Bacou et al.
6,396,351 B1 * 5/2002 Buescher et al. ........... 330/308

FOREIGN PATENT DOCUMENTS

| EP | 0 828 357 A2 | 3/1998 |
| JP | 63-073723 | 4/1988 |
| JP | 01-117512 | 5/1989 |
| WO | 0167597 | * 3/2000 |

OTHER PUBLICATIONS

Taylor et al. A ZpA/5Hz 622Mb/s GaAs MESFET Transimpedance Amplifier, Solid State Circuits Conference 1994 41st ISSCC Feb. 16–18, 1994 pp. 254–255.*

* cited by examiner

Primary Examiner—Michael B Shingleton
(74) Attorney, Agent, or Firm—Katten Muchin Zavis Rosenman

(57) ABSTRACT

A preamplifier for use in an optical signal receiver is provided, which is capable of circumventing a problem of oscillation or shortage of bandwidth even in case an employed photodiode has a capacity value which inherently causes oscillation or shortage of bandwidth. The preamplifier includes a variable gain amplifier connected to a light receiving element for converting a received light signal to electric current; a variable feedback resistor connected to an input and output of the variable gain amplifier; and a band detection circuit for detecting a signal band amplified by the variable gain amplifier, wherein a band control signal obtained from the band detection circuit controls the band of the variable gain amplifier.

19 Claims, 19 Drawing Sheets

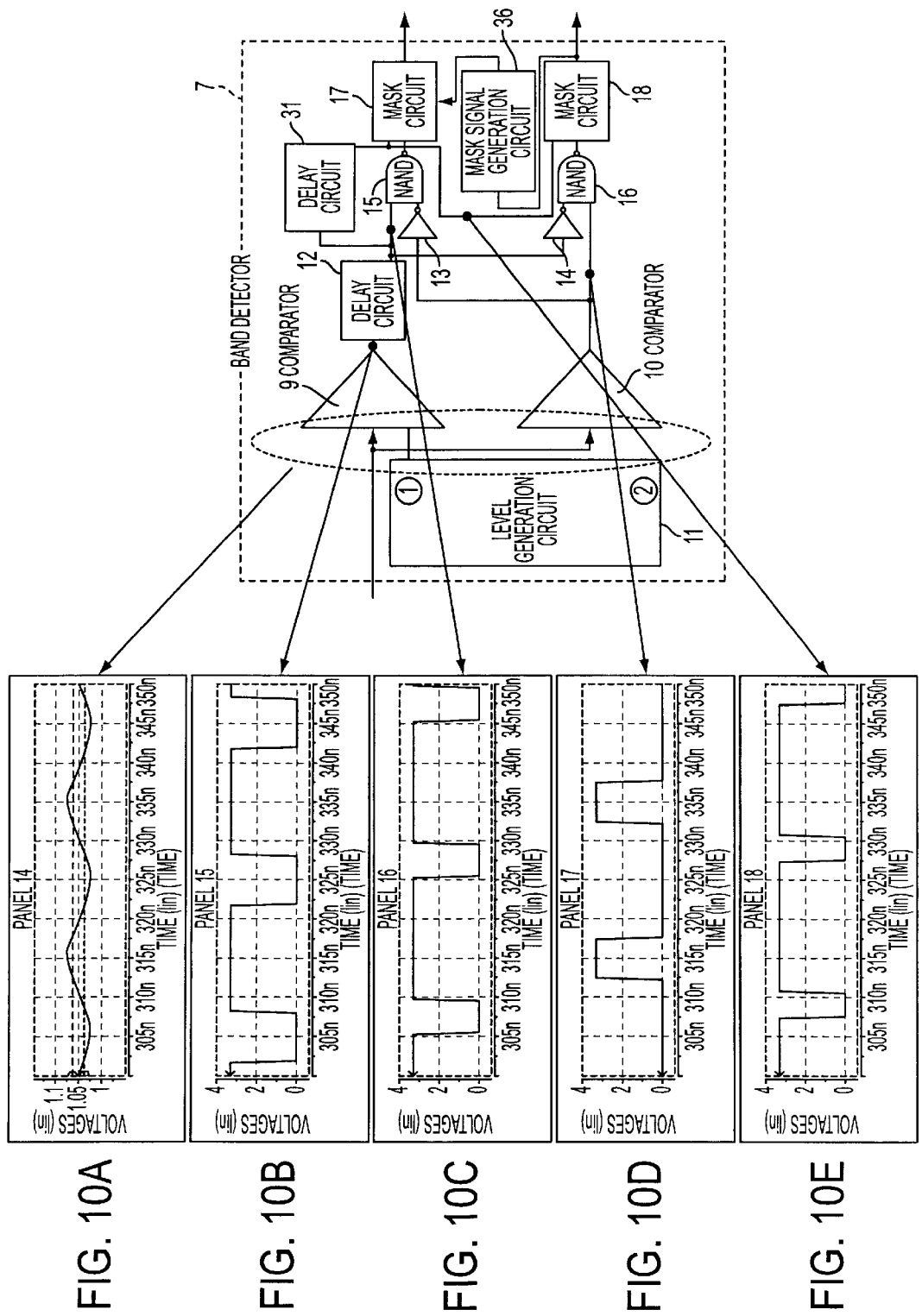

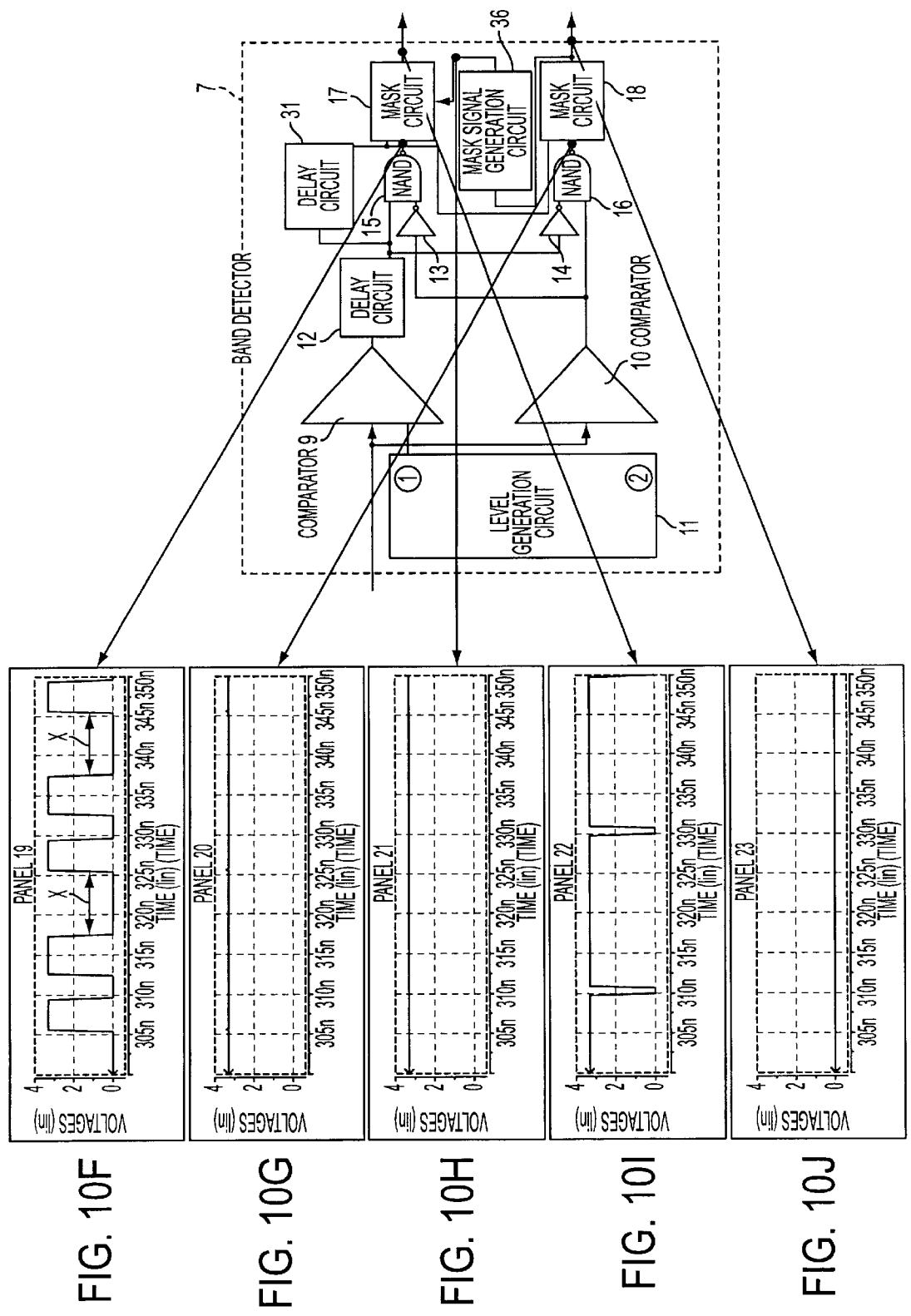

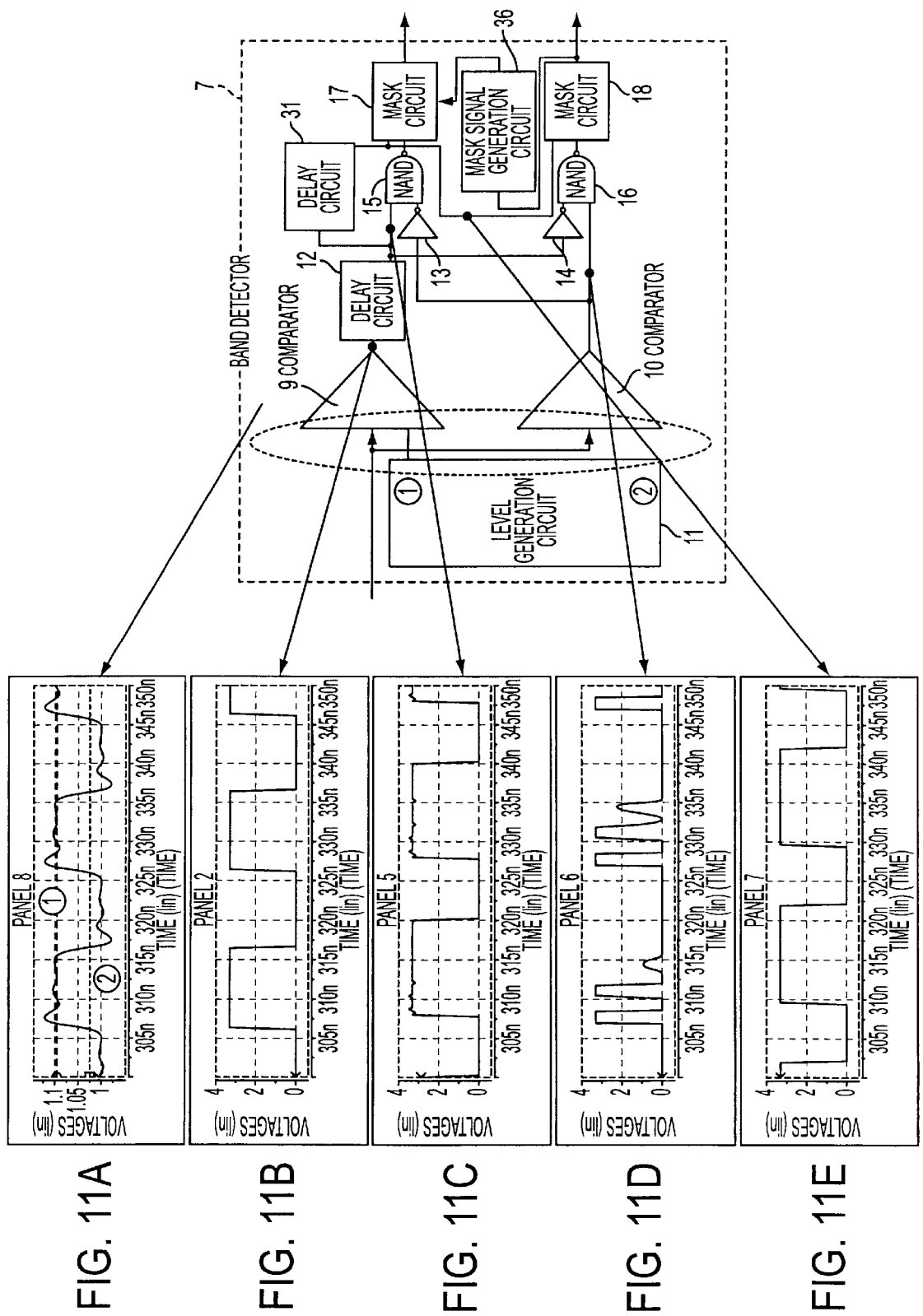

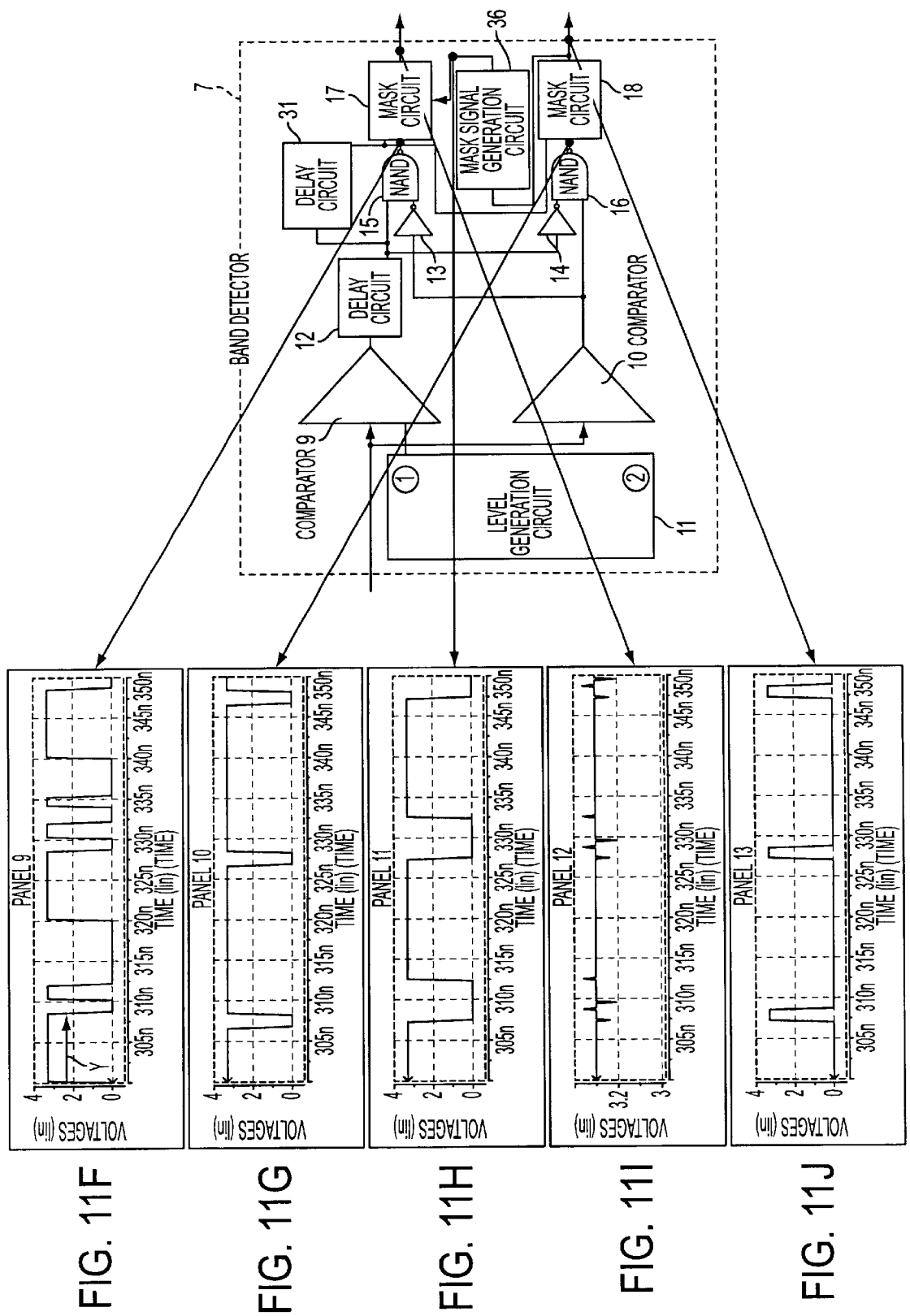

PREAMPLIFIER

This application is a continuation of international application No. PCT/JP00/01358, filed Mar. 6, 2000.

FIELD OF THE INVENTION

The present invention relates to a preamplifier, and more particularly a preamplifier for use in an optical signal receiver.

BACKGROUND OF THE INVENTION

An example of a conventional preamplifier for use in an optical signal receiver is shown in FIG. 1. In this FIG. 1, received light is converted into electric current by means of a photodiode. A preamplifier has a function of converting the current having been converted from the optical light into a voltage signal to output.

Here, there lies a predetermined relation between a gain $A_0$ of the preamplifier and a signal bandwidth ($f_{-3dB}$). Namely, the signal bandwidth ($f_{-3dB}$) is determined by; total input capacity (Cin) consisting of capacity between the photodiode terminals, parasitic capacity caused by mounting, etc., and capacity of an FET constituting the preamplifier, etc., feedback resistance (Rf), and amplifier gain $A_0$, in accordance with the following formula (1).

$$f_{-3dB} = A_0 / (2\pi Rf * Cin) \qquad (1)$$
$$= 1 / (2\pi Zin * Cin)$$

(Here, Zin=Rf/$A_0$ is an input impedance of the preamplifier.)

Now, because the amplifier itself normally has a bandwidth, it is necessary to design the signal bandwidth $f_{-3dB}$ so that the signal bandwidth is sufficiently smaller than the amplifier bandwidth. However, in the optical signal receiver, there are cases of extremely small capacity between terminals, or on the contrary, extremely large capacity between terminals. Such cases depend on dispersion in the photodiode characteristic.

In the case when the capacity between terminals is extremely small, the total input capacity (Cin) becomes small. In this case the signal bandwidth $f_{-3dB}$ is extended near to the amplifier bandwidth, as can be understood from formula (1). Thus oscillation or ringing is produced.

This oscillation or ringing condition will be explained referring to FIG. 2. FIG. 2A is shown by a scale width of 140 μs. On the other hand, FIGS. 2B, 2C are shown by scale widths of 200 ns, in which a portion of the amplifier output period shown in FIG. 2A is enlarged. As shown in FIGS. 2B, 2C, a high-frequency oscillation signal is superposed onto a rectangular wave signal, which illustrates an oscillation or ringing condition.

To the contrary, in case the capacity between terminals of the photodiode is extremely large, the total input capacity (Cin) becomes large, producing an extremely reduced signal bandwidth $f_{-3dB}$. Therefore, as a portion of the preamplifier output period is enlarged in FIG. 3, there appears a condition that a rectangular wave signal component cannot be passed through. Such a condition may be understood from FIGS. 3B, 3C in which a portion period of FIG. 3A are enlarged with a scale identical to FIG. 2. The rectangular wave signal disappeared.

Meanwhile, when employing an APD (avalanche photodiode) as a photodiode, a photodiode APD has a characteristic of having small capacity when an input light signal is small, while having large capacity when an input light signal is large. There has been a known technology of preventing oscillation using this characteristic. That is, controlling a bias voltage of the photodiode APD by detecting preamplifier output amplitude which may vary in proportion to the input light signal of the photodiode APD (as having been disclosed in the official gazette of Japanese Unexamined Patent Publication No. Hei-7-304922, etc.)

The configuration block diagram in the above disclosure is shown in FIG. 4. In this FIG. 4, an output of the photodiode APD is input into preamplifier 2. An output of preamplifier 2 is led to AGC circuit 4, in which it is controlled so as to produce a constant gain.

A peak detection circuit 5 detects a peak value (amplitude) of an output of AGC circuit 4, to control a bias output of an APD bias control circuit 52 via a phase compensation circuit 51.

Now, a capacity value of the photodiode APD includes dispersion produced by a varying manufacturing condition, etc. In some cases, there is a photodiode APD which inherently has a capacity value causing oscillation or shortage of bandwidth. Therefore, when using a photodiode APD having such a capacity value in the configuration shown in FIG. 4, it is not possible to circumvent oscillation or shortage of bandwidth. The reason is, according to this configuration, that the amplitude detection for use in controlling bias voltage is carried out using a signal after passing through preamplifier 2 and AGC circuit 4.

SUMMARY OF THE INVENTION

Accordingly, it is an object of the present invention to provide a preamplifier which is capable of circumventing a problem of oscillation or shortage of bandwidth even in case an employed photodiode has a capacity value which inherently causes oscillation or shortage of bandwidth.

In order to attain the aforementioned object, according to the present invention, a band detection circuit is employed so as to detect a bandwidth of a preamplifier directly, thereby to control to obtain an appropriate preamplifier band using a band control signal being output from the band detection circuit.

As a preferred embodiment of the present invention, the preamplifier includes; a variable gain amplifier connected to a light receiving element for converting a received light signal to electric current; a variable feedback resistor connected to both an input and output of the variable gain amplifier; and a band detection circuit for detecting a signal band being amplified by the variable gain amplifier. Thus the band of the variable gain amplifier is controlled by a band control signal obtained from the band detection circuit.

As a preferred embodiment of a preamplifier according to the present invention, the aforementioned band detection circuit includes; a band detector; and a detection signal hold circuit for holding a detection signal obtained from the band detector. The aforementioned band detector includes; a level generation circuit for outputting two internally divided levels by resistance-dividing a bottom value and a peak value of a signal being input to the band detector; a first comparator for comparing an upper level side of the two internally divided levels being output from the level generation circuit with a signal being input to the band detector; a second comparator for comparing a lower level side of the two internally divided levels with a signal being input to the band detector; a first delay circuit for delaying the second comparator output for a predetermined time; and a comparison circuit for comparing the timing of an output of the first delay circuit with the timing of the first comparator output.

As another preferred embodiment of a preamplifier according to the present invention, the preamplifier further includes a bitrate detector, and an output terminal of the bitrate detector is connected to a bitrate signal input terminal of the band detection circuit.

Further scopes and features of the present invention will become more apparent by the following description of the embodiments with the accompanied drawings.

BRIEF DESCRIPTION OF THE DRAWINGS

FIG. 10 shows an operational waveform in case of large input capacity in preamplifier 2.

FIG. 11 shows an operational waveform in case of small input capacity in preamplifier 2.

DETAILED DESCRIPTION OF THE PREFERRED EMBODIMENTS

The preferred embodiment of the present invention is described hereinafter referring to the charts and drawings, wherein like numerals or symbols refer to like parts.

Figure 5:
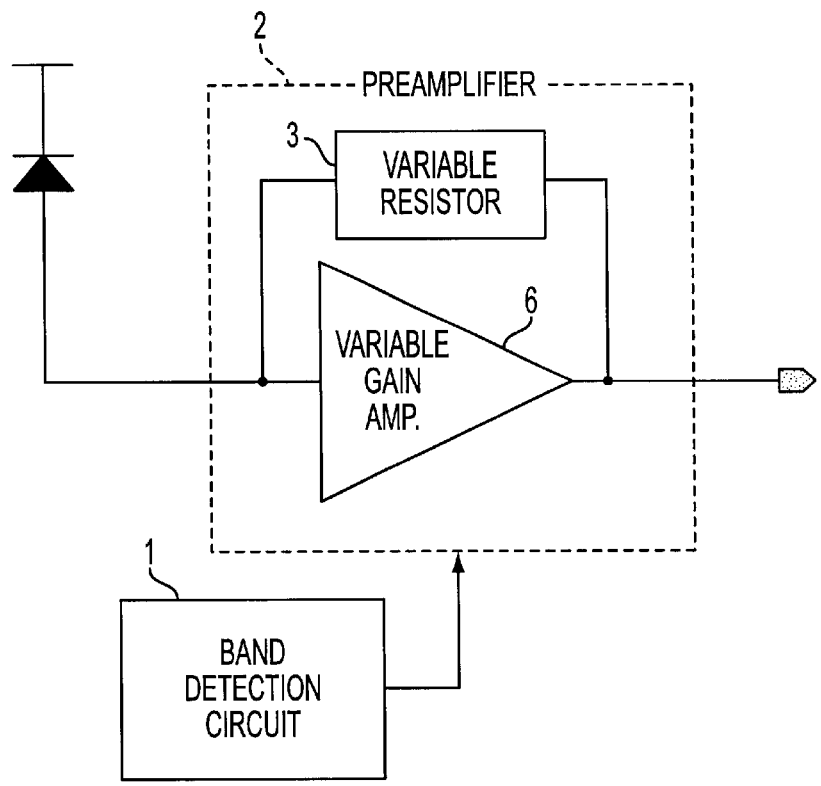
FIG. 5 shows a diagram illustrating a conceptual configuration of the present invention.

FIG. 5 is a diagram illustrating a conceptual configuration of the present invention. A band of a preamplifier 2 is detected by a band detection circuit 1 to output a band control signal. Using this, it is possible to control so that the band of preamplifier 2 becomes constant.

Input impedance is controlled as one means to control the band of preamplifier 2. More specifically, this is enabled by altering either a resistance value of a feedback resistor 3 or a gain of a variable gain amplifier 6.

Figure 6:
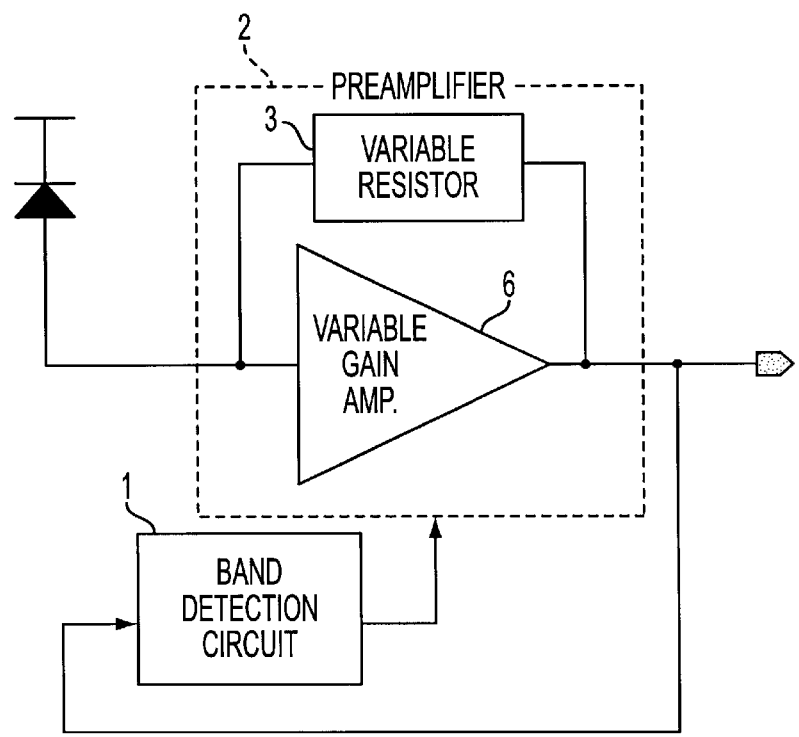
FIG. 6 shows one embodiment for detecting a bandwidth of preamplifier 2 using a band detection circuit 1.

FIG. 6 shows one embodiment of detecting the band of preamplifier 2 by means of band detection circuit 1, by which it becomes possible to detect the band directly from an output of preamplifier 2. In other words, because it is an object to control the band of preamplifier 2, it is direct and most effective to detect the band from the output of preamplifier 2.

Figure 7:
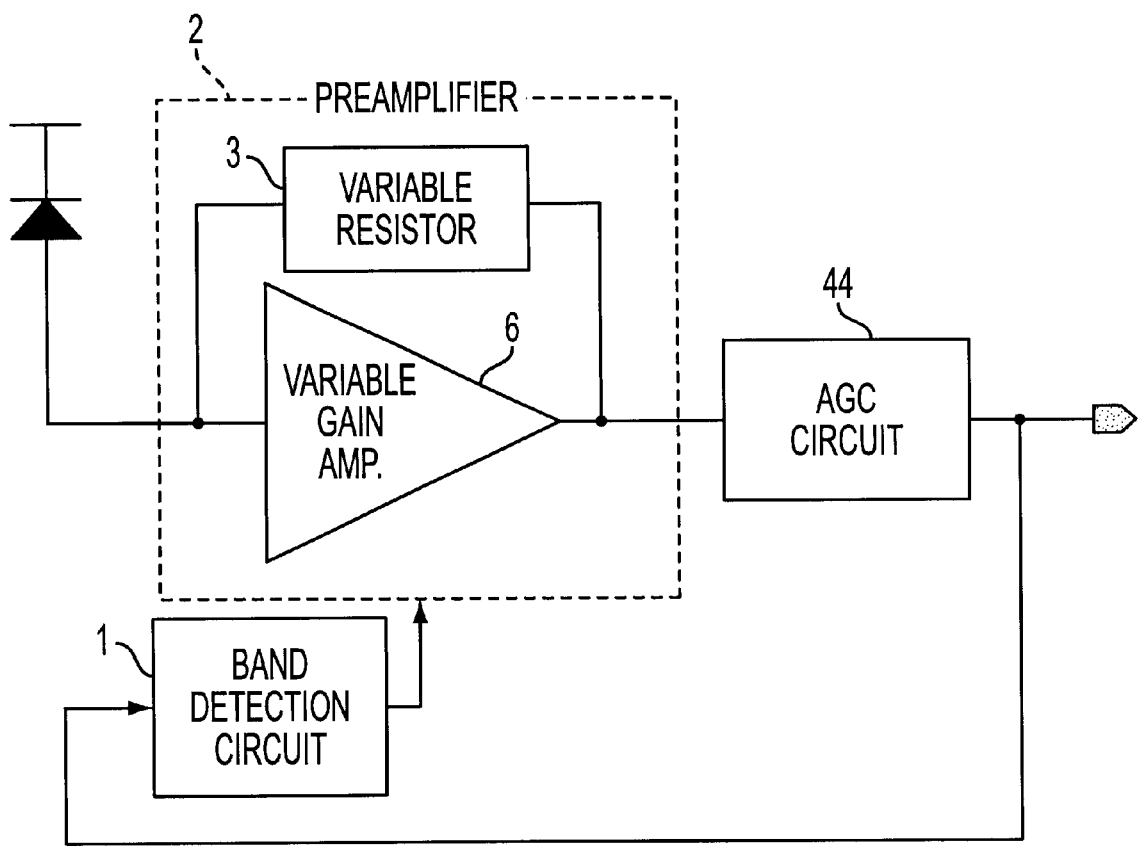
FIG. 7 shows an embodiment of band detection using an output of an AGC circuit.

Also, according to the band detection method shown in FIG. 7, an output signal of preamplifier 2 is linearly amplified by an AGC (automatic gain control) circuit 44 to a certain value irrespective of the output amplitude of preamplifier 2. This signal is input to band detection circuit 1. Therefore, band detection circuit 1 has a signal for detection having sufficient amplitude. Thus band detection with a small error can be performed.

Figure 8:
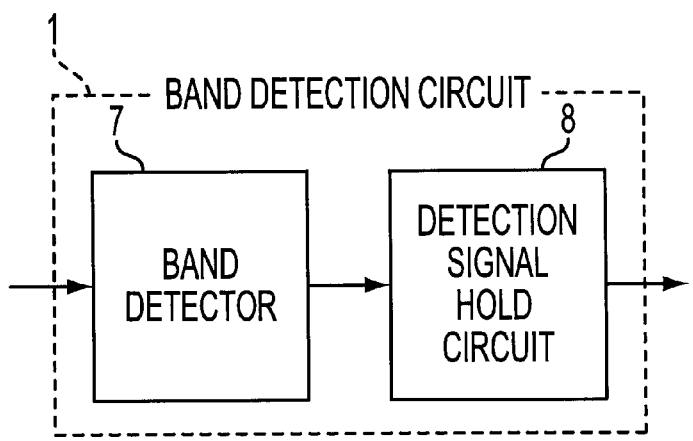
FIG. 8 shows an embodiment of band detection circuit 1.
Figure 9:
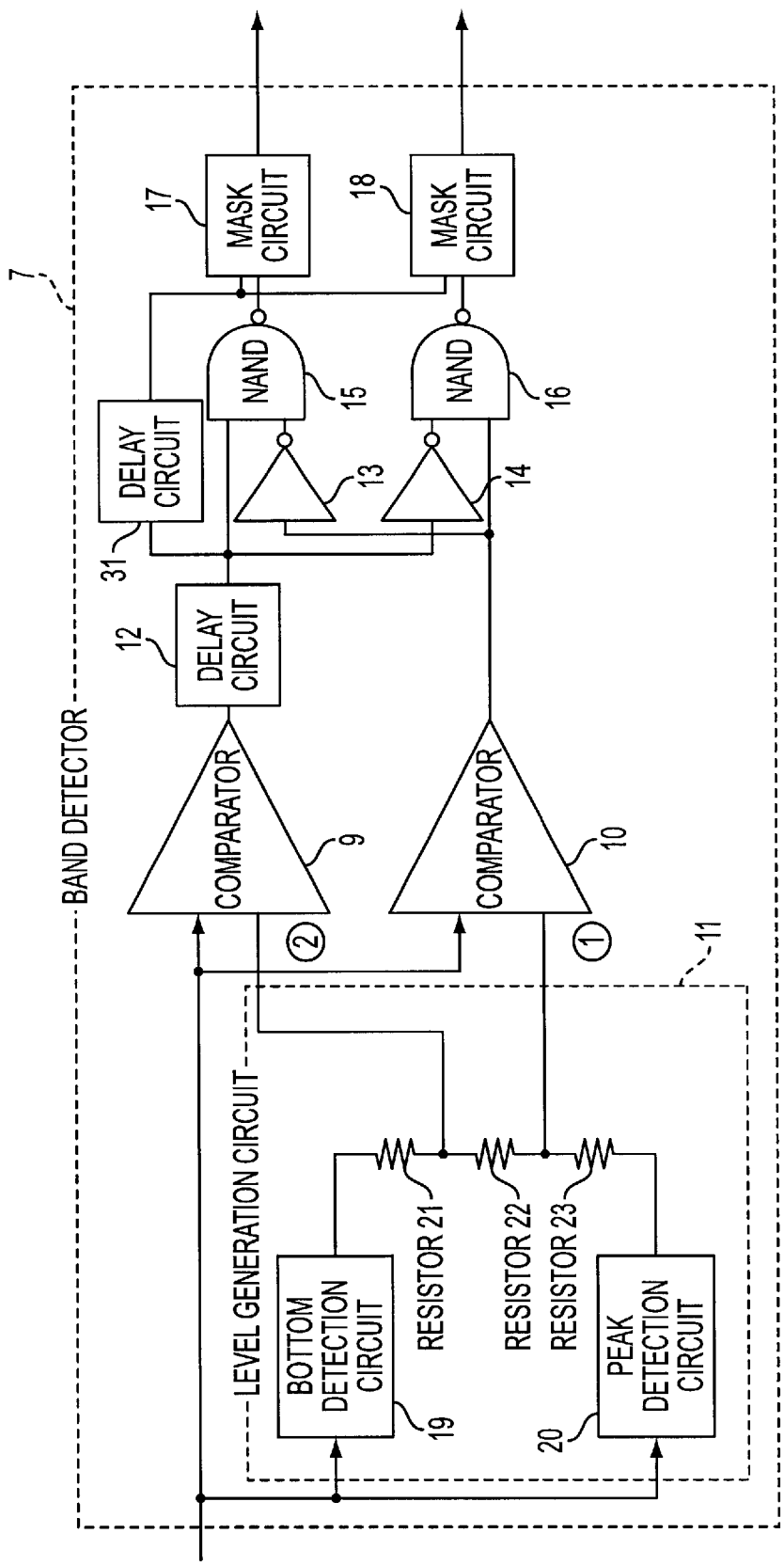
FIG. 9 shows one circuit embodiment of a band detector 7.

FIG. 8 shows a configuration example of band detection circuit 1. Band detection circuit 1 is constituted by a band detector 7 and a detection signal hold circuit 8. One circuit embodiment of band detector 7 is shown in FIG. 9. In this embodiment, by detecting a rise time of an input signal of band detector 7, it is determined whether or not the band is appropriate.

Namely, in FIG. 9, a level generation circuit 11 includes a bottom detection circuit 19 and a peak detection circuit 20. Both a bottom value and a peak value of the signal output from preamplifier 2 are respectively detected by bottom detection circuit 19 and peak detection circuit 20. The detected values of bottom detection circuit 19 and peak detection circuit 20 are resistance-divided by resistors 21, 22 and thus two arbitrary internally divided levels can be obtained.

Here, for the sake of easy understanding, waveforms of various portions in band detector 7 are shown in comparison in FIGS. 10, 11. FIG. 10 shows a case of either large input capacity of preamplifier 2, or low band frequency, while FIG. 11 shows a case of either small input capacity of preamplifier 2, or high band frequency.

Referring back to FIG. 9, two internally divided levels ①, ② are respectively input to comparators 10, 9, to compare to an input signal of band detector 7. Comparator 9 outputs a period during which the input signal (FIGS. 10A, 11A) exceeds the lower internally-divided level ② (FIGS. 10B, 11B).

Meanwhile, comparator 10 outputs a period during which the input signal exceeds the upper internally-divided level ① (FIGS. 10D, 11D). A delay circuit 12 produces a delay for a predetermined period against the output of comparator 9 (FIGS. 10C, 11C).

Thereafter, the signal after the delay is produced and the output of the aforementioned period in which the input signal exceeds the upper internally-divided level ① are compared. In this comparison, if the delayed signal appears earlier, then it is determined the band is too low. To the contrary, if the signal rise timing at which the input signal exceeds the upper internally-divided level ① appears earlier, then it is determined the band is too high.

In FIG. 10, the rise timing of a signal in which an output of comparator 9 is delayed for a predetermined time, that is an output signal of delay circuit 12 (refer to FIG. 10B), appears earlier than the rise timing of a signal exceeding the upper internally-divided level ① of the input signal, that is an output signal of comparator 10 (refer to FIG. 10D).

Therefore, FIG. 10 corresponds to large input capacity of preamplifier 2.

The fact that the rise timing of the output of delay circuit 12 appears earlier than the signal exceeding upper internally-divided level ①, or the rise timing of the output of comparator 10 (refer to FIG. 10D), is determined in the following way using signal outputs of mask circuits 17, 18.

In FIG. 10, the output of delay circuit 12 is input to one input terminal of a NAND gate 15, and the output of comparator 10 is input to the other input terminal of NAND gate 15 via a NOT circuit 13. Thus an output of NAND gate 15 becomes as shown in FIG. 10F.

Meanwhile, in FIG. 10, the output of delay circuit 12 is input to one input terminal of a NAND gate 16 via a NOT circuit 14, and the output of comparator 10 is input to the other input terminal of NAND gate 16. Thus an output of NAND gate 16 becomes as shown in FIG. 10G.

In FIG. 10F, during the time difference from the rise timing of the output of delay circuit 12 to the rise timing of the output of comparator 10, an output logic level of NAND gate 15 is kept low, while an output logic level of NAND gate 16 is continuously high.

Meanwhile, in an example shown in FIG. 11, the output of delay circuit 12 appears later than the output of comparator 10. Therefore, in this case, an input capacity of preamplifier 2 is small, which is not possible to circumvent oscillation.

This is determined from the outputs of NAND gates 15, 16, as having been explained in FIG. 10, in which the output logic level of NAND gate 15 is kept high (FIG. 11F), while the output logic level of NAND gate 16 is low.

Additionally, in FIG. 10F, the logic level is low in the period "X" also. This may possibly be determined as the period of time difference from the rise timing of the output of delay circuit 12 to the rise timing of the output of comparator 10. Similarly, in FIG. 11F, a low level appears in the period of "Y" during which the logic level is originally high.

Figure 12:
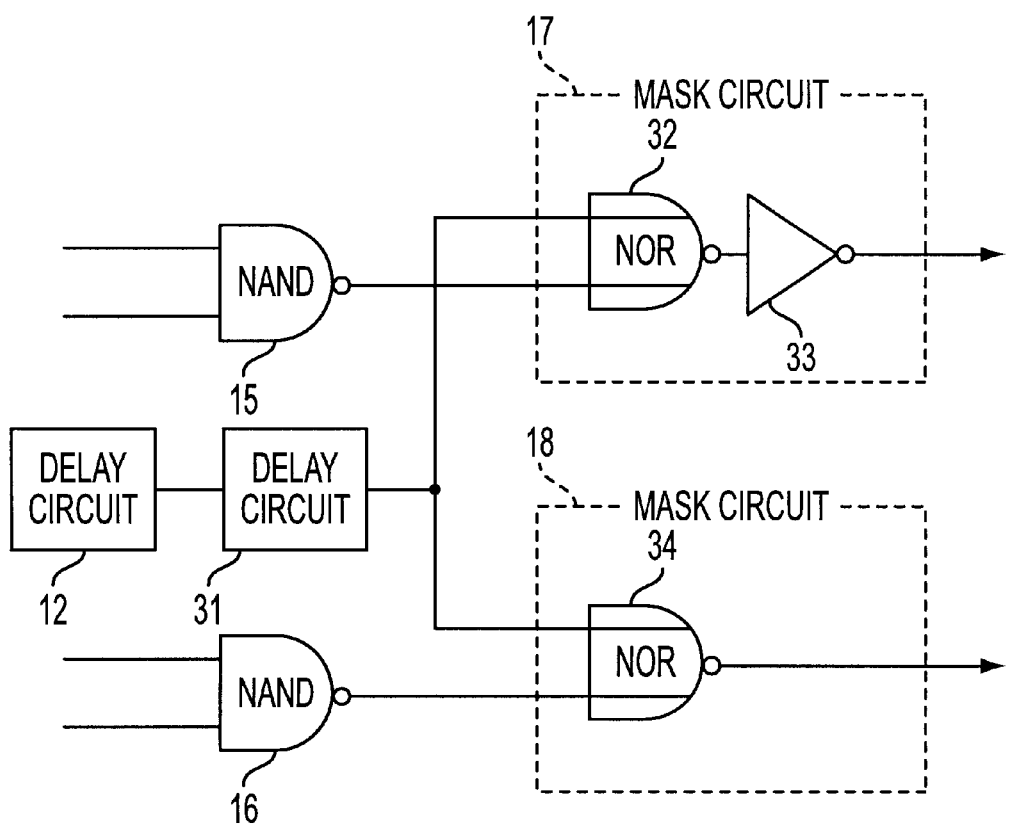
FIG. 12 shows an embodiment of a mask circuit configuration.

To solve this problem, there are provided mask circuits 17, 18 shown in FIG. 9. FIG. 12 shows configurations of mask circuits 17, 18, in which mask circuit 17 is constituted by a NOR gate 32 and a NOT circuit 33, while mask circuit 18 is constituted by a NOR gate 34. The output of delay circuit 12 is further delayed by a delay circuit 31, so that a control signal is not output when this delay output signal is high in logic level.

Here, in case of oscillation or near oscillation condition, the oscillation or large ringing is produced at higher frequency than the intended frequency band. Therefore the high band is easily determined and it is possible to restore to the normal band in which oscillation does not occur.

However, in case of oscillation or a similar condition, it may possibly occur that a signal is output in which low band is determined by mistake because it is not possible to mask an unnecessary signal produced at the fall timing. To avoid such a condition, when a signal indicating the determination of high band is output, a signal output is masked so as not to output a signal indicating the determination of low band for a certain period.

Figure 13:
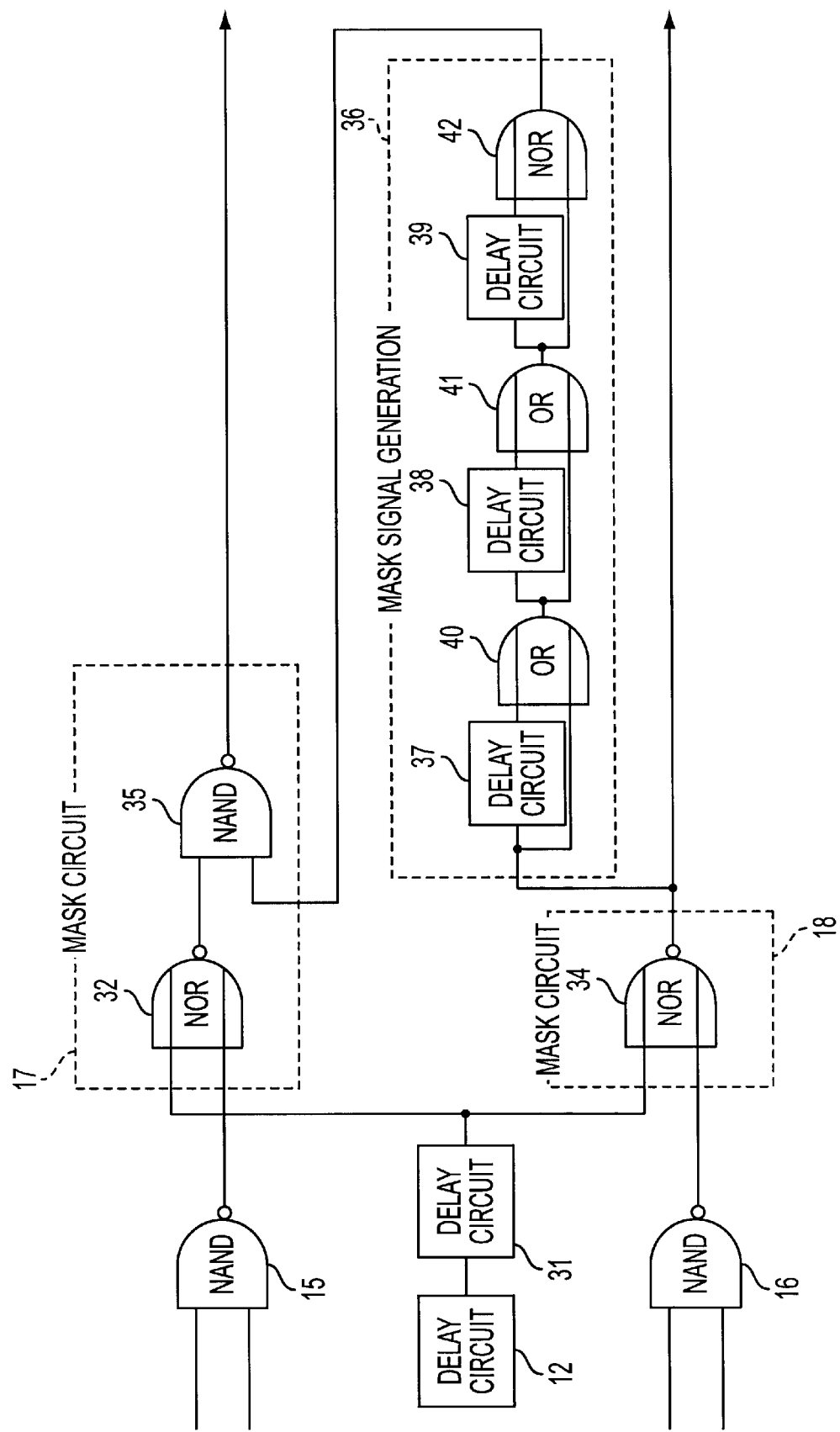
FIG. 13 shows another embodiment of the mask circuit configuration.

An embodiment to realize this is shown in FIG. 13. Namely, an output of mask circuit 17 is controlled through a mask signal generation circuit 36 having a plurality of stages of delay circuits 37 to 39 (as an example, three stages are shown here). Mask circuit 17 includes a NOR gate 32 and a NAND gate 35, and an output of NOR gate 32 is delayed for the delay time produced by a mask signal generation circuit 36.

Figure 19:
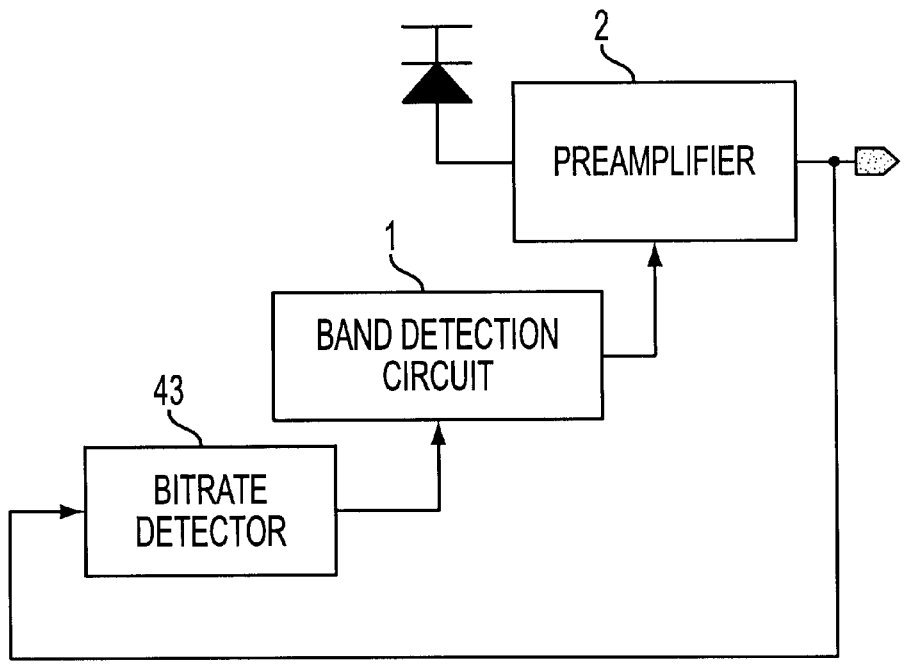
FIG. 19 shows a typical example of FIG. 18.

When the amplitude of preamplifier 2 is decreased because of variation of the input signal amplitude, disappearance of ringing which was existing previously, or any other similar reasons, it becomes necessary to decrease the level of peak detection circuit 20 or increase the level of bottom detection circuit 19 in the embodiment shown in FIG. 19.

Figure 14:
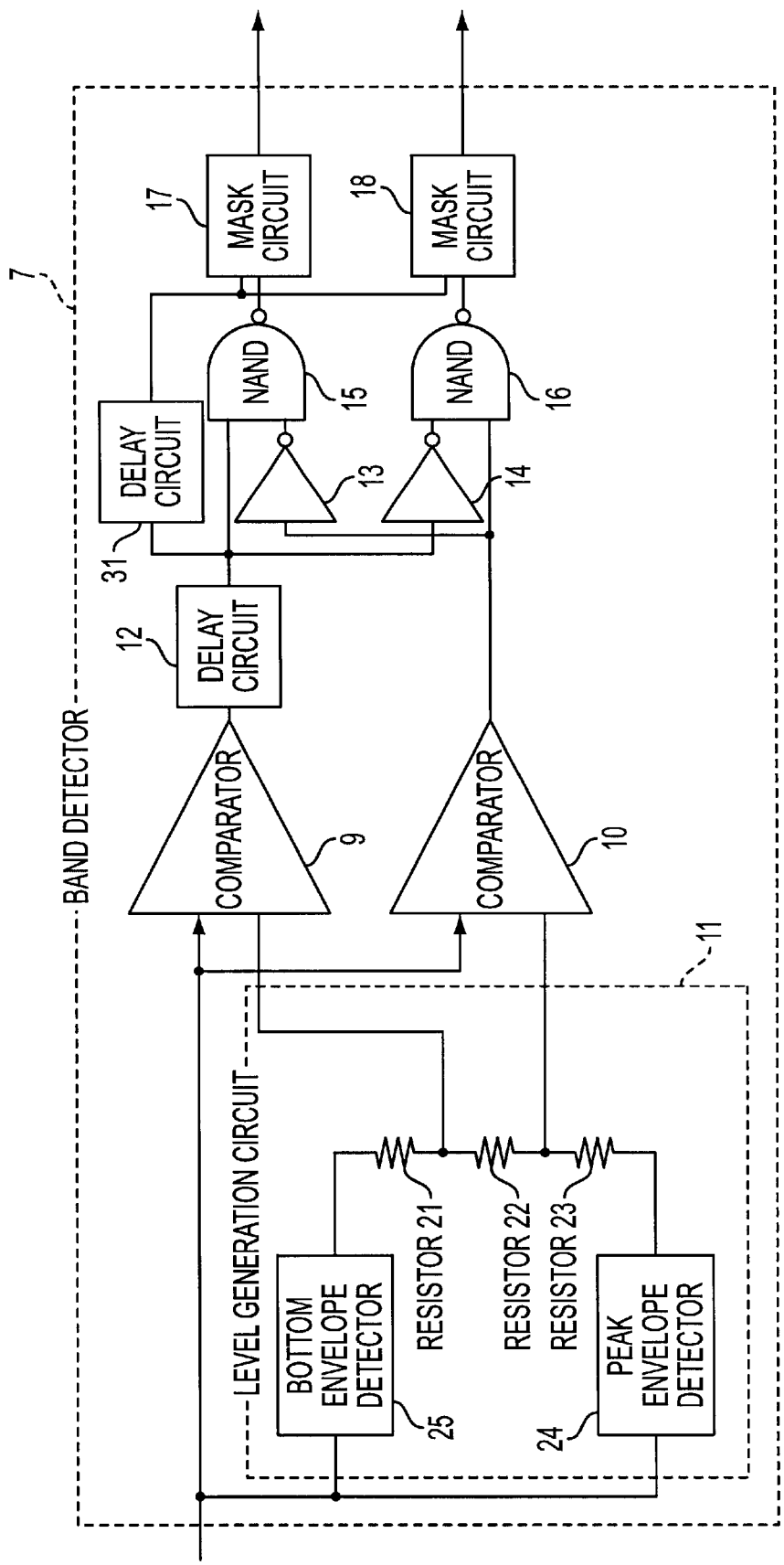
FIG. 14 shows another embodiment of band detector 7.

However, in either peak detection circuit 20 or bottom detection circuit 19, there is no other way than relying on leak current. When a certain degree of fast response is required for peak detection circuit 20 and bottom detection circuit 19, there are required a peak envelope detector 24 and a bottom envelope detector 25 in level generation circuit 11, as shown in the embodiment in FIG. 14.

Figure 15:
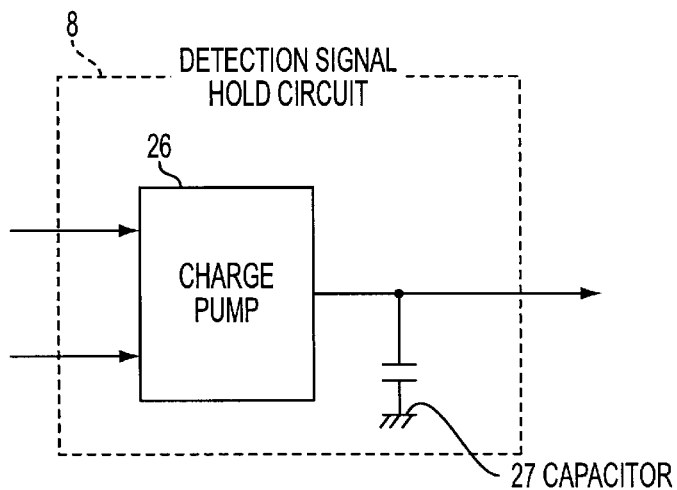
FIG. 15 shows an embodiment of a detection signal hold circuit in band detection circuit 1.
Figure 16:
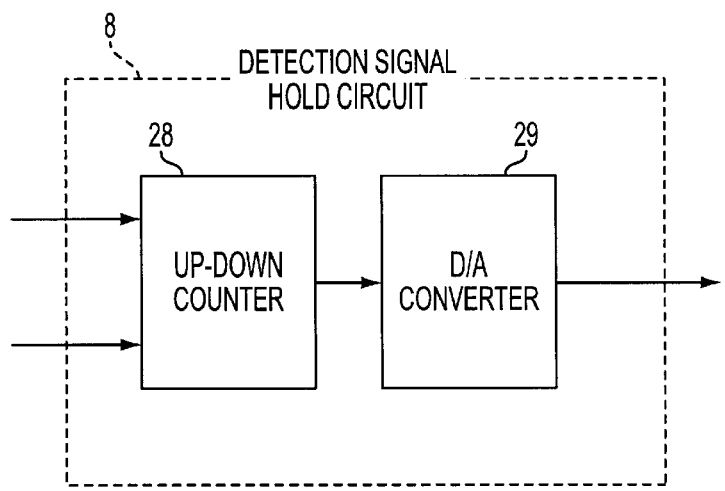
FIG. 16 shows another embodiment of the detection signal hold circuit in band detection circuit 1.
Figure 17:
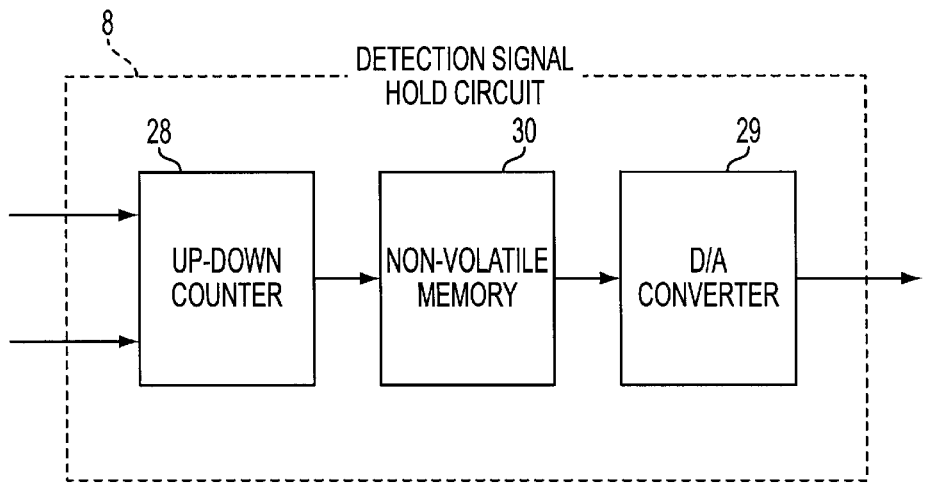
FIG. 17 shows an embodiment of a configuration in which the embodiment shown in FIG. 16 is expanded.

Additionally, band detection circuit 1 shown in FIG. 8 includes detection signal hold circuit 8 for holding the detection signal (output of mask circuits 17, 18) obtained from band detector 7. FIGS. 15, 16, and 17 are embodiment configurations of detection signal hold circuit 8.

In the configuration shown in FIG. 15, an output of a charge pump 26 is charged into a capacitor 27. According to this configuration, an input impedance control signal is entirely analog-processed. Therefore a delicate adjustment can be attained with a simple configuration.

Meanwhile, according to the embodiment configurations shown in FIGS. 16, 17, the detection signal of band detection circuit 1 (i.e. the output of mask circuits 17, 18) is once converted into a logic signal using an up-down counter 28. The logic signal is then converted into an analog signal using a digital-to-analog converter 29. Thus, it becomes easy to set control accuracy by means of an input impedance control signal at the conversion accuracy of up-down counter 28 and digital-to-analog converter 29.

In the configuration shown in FIG. 17, a non-volatile memory 30 is provided in addition to the configuration shown in FIG. 16, in which an adjustment level before shipping the product is stored. This enables to ship the produce at appropriate impedance, by which the band adjustment becomes unnecessary at the time of actual operation. It becomes possible to vary to an appropriate band against a signal bitrate.

Figure 18:
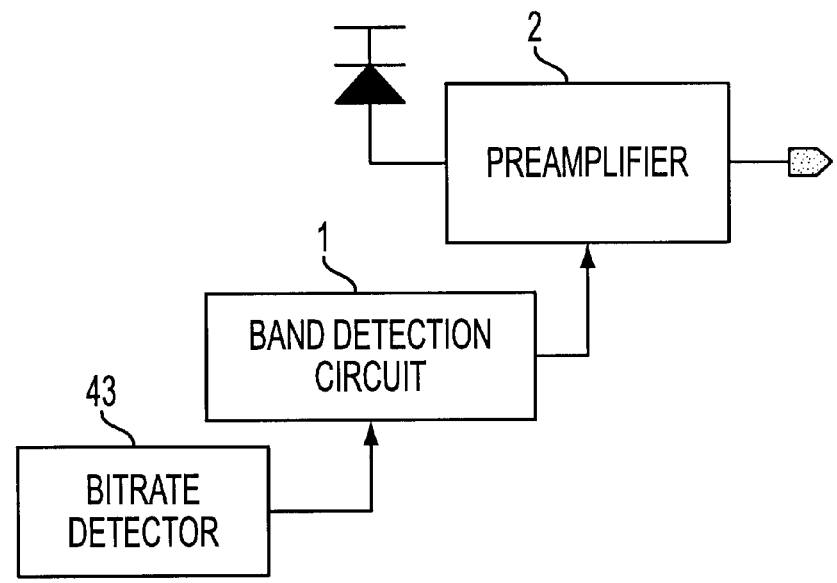
FIG. 18 shows another embodiment of the present invention.

Here, as another embodiment, it is possible to obtain an appropriate band timely by inputting a control signal corresponding to a bitrate into a bitrate signal input terminal of band detection circuit 1. FIG. 18 shows a conceptual configuration diagram based on the above-mentioned method. A bitrate detector 43 is provided and the output signal thereof is input to band detection circuit 1.

Figure 20:
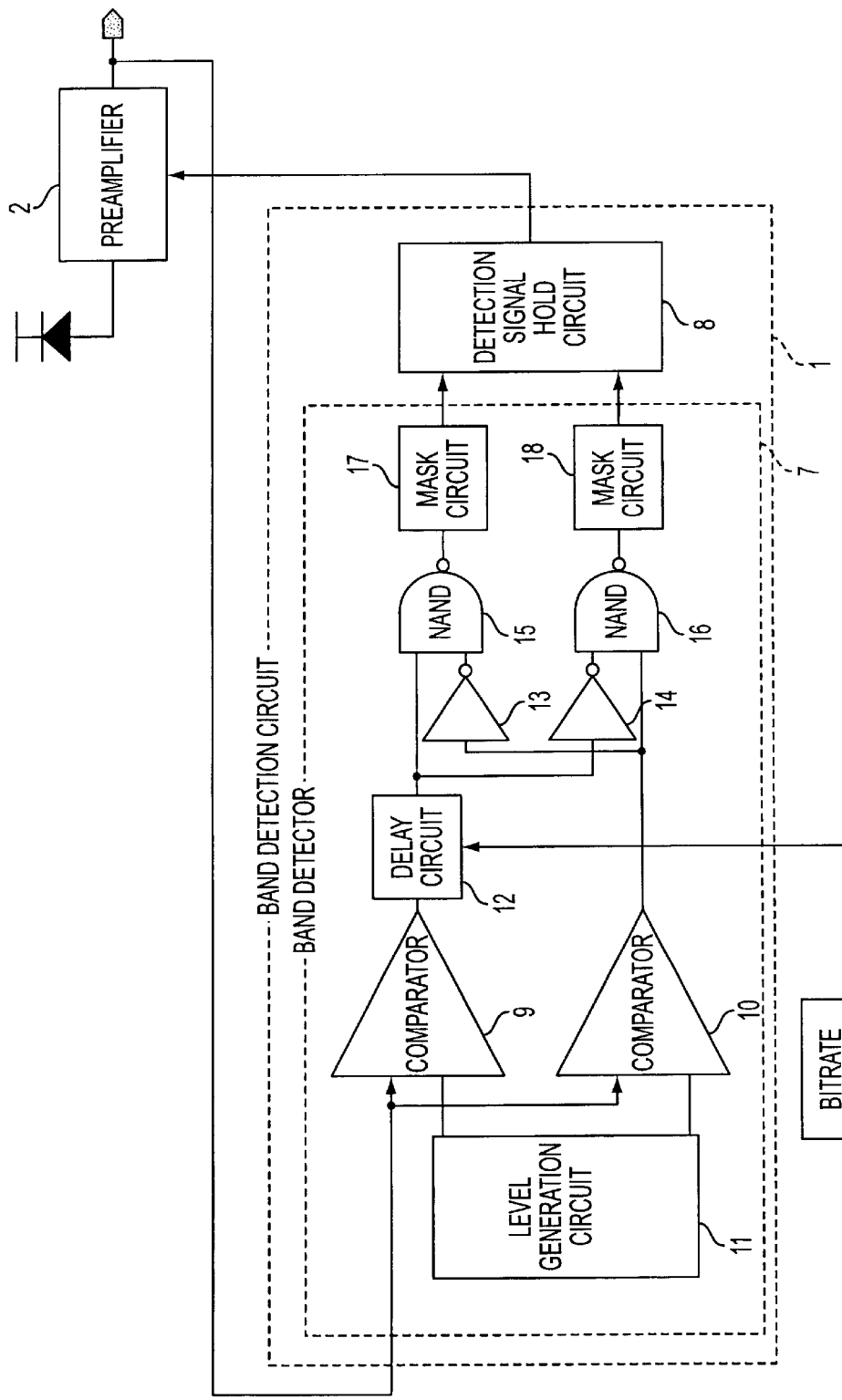
FIG. 20 shows a typical example corresponding to FIG. 19.

An embodiment of this conceptual configuration is shown in FIG. 19. In this embodiment shown in FIG. 19, a bitrate is detected from an output of preamplifier 2 and the detected signal thereof is input to band detection circuit 1. In the configuration shown in FIG. 20, a bitrate is further detected to control a delay amount produced by delay circuit 12 using the detected bitrate signal.

Figure 1:
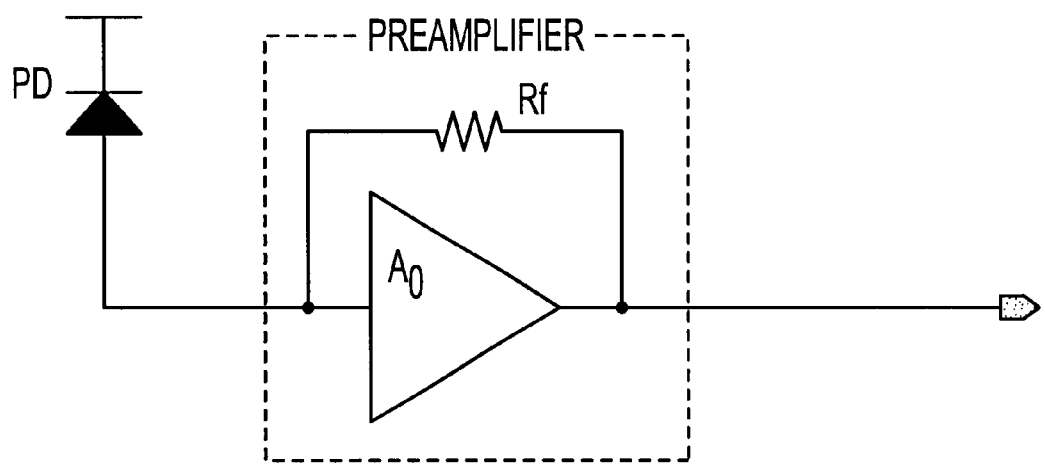
FIG. 1 shows a diagram illustrating one example of a conventional preamplifier in an optical signal receiver.
Figure 2:
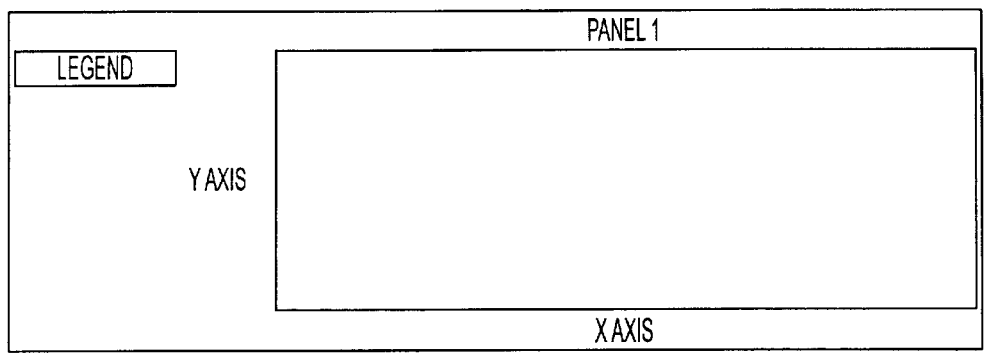
FIG. 2 shows a diagram illustrating occurrence of an oscillation or ringing condition when a preamplifier input capacity is small.
Figure 2A:
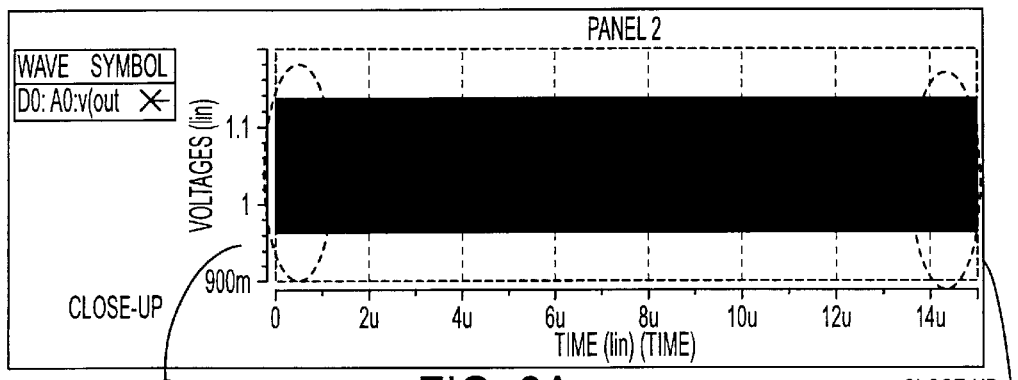
Figure 2B:
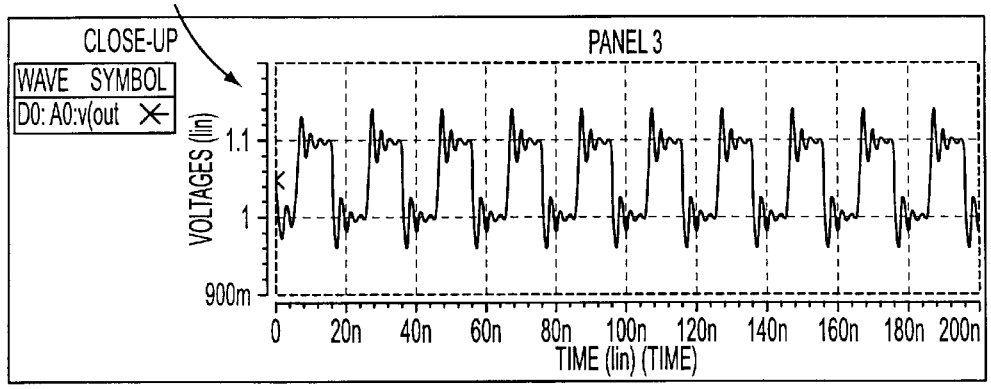
Figure 2C:
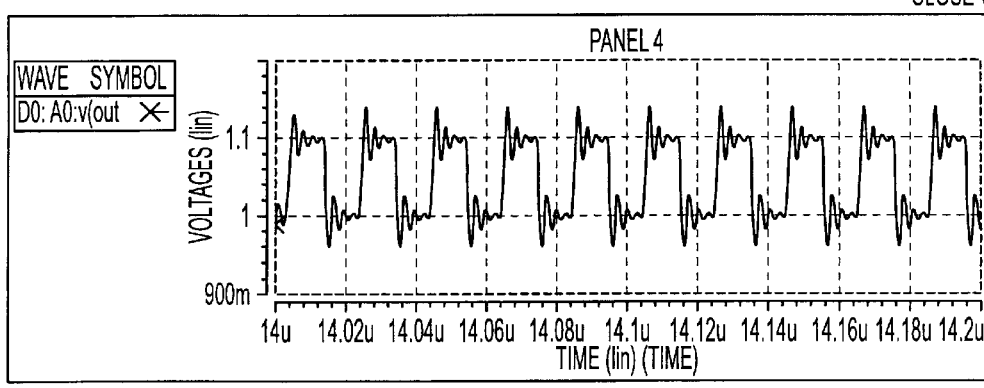
Figure 3:
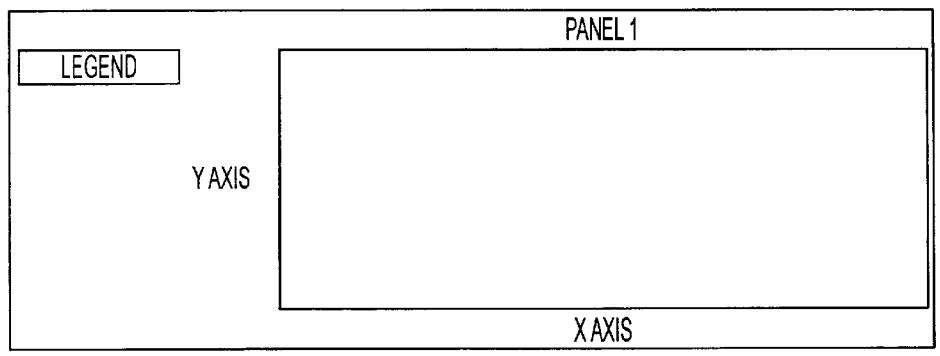
FIG. 3 shows a low signal pass band when a preamplifier input capacity is large.
Figure 3A:
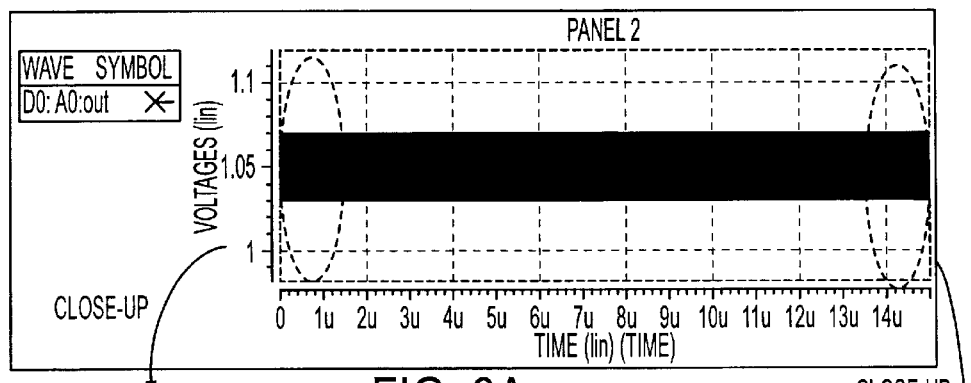
Figure 3B:
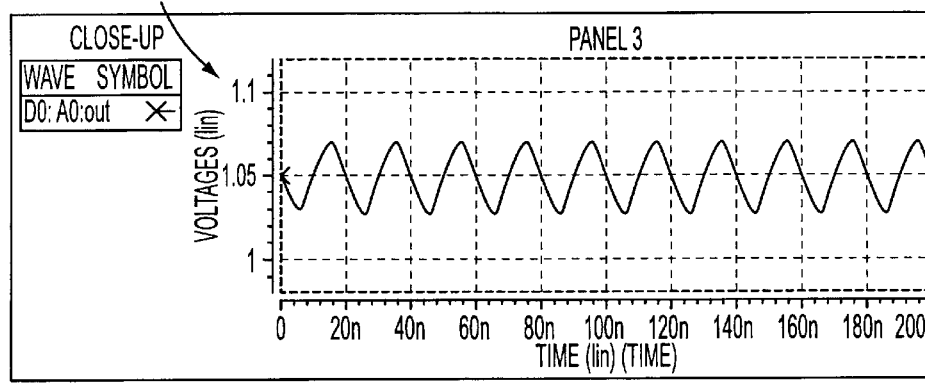
Figure 3C:
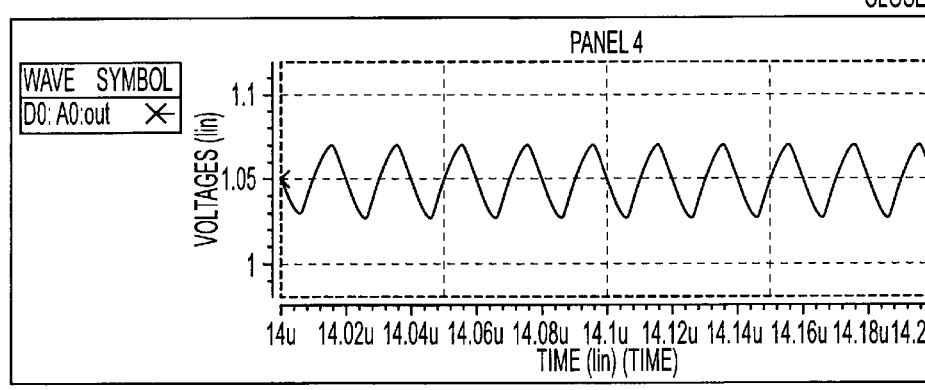
Figure 4:
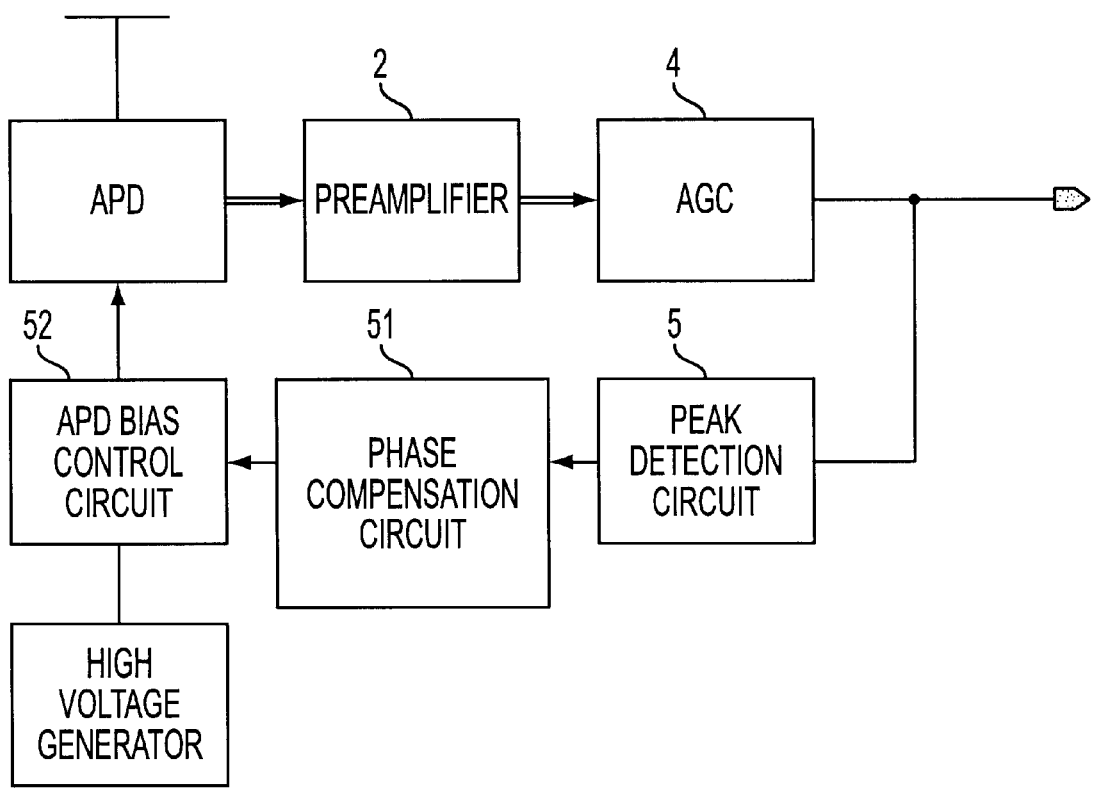
FIG. 4 shows a diagram illustrating a conventional art of circumventing oscillation.

The aspects of the effects according to the embodiment of the present invention are shown in FIGS. 21, 23 in contrast to FIGS. 2, 3, respectively.

Figure 21D:
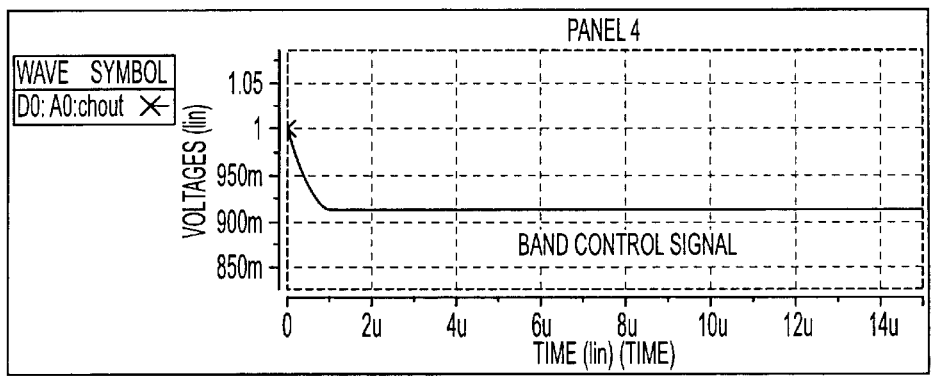
FIG. 21 shows an effect of the present invention corresponding to FIG. 2.
Figure 21A:
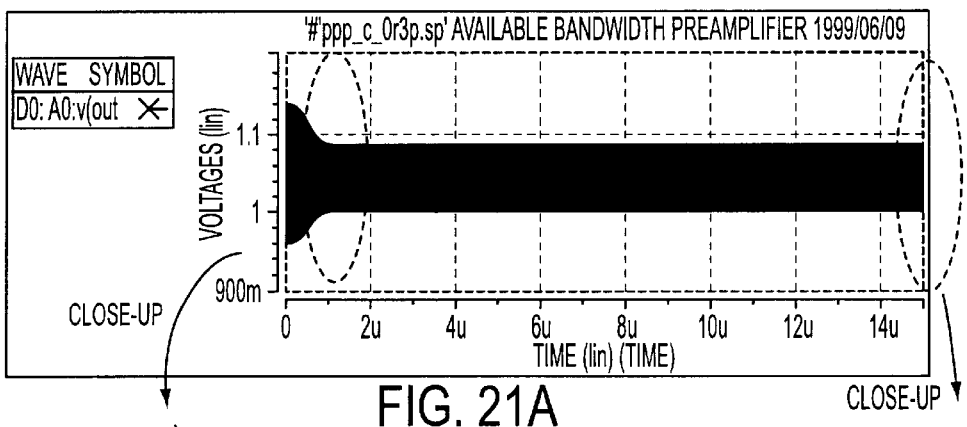
Figure 21B:
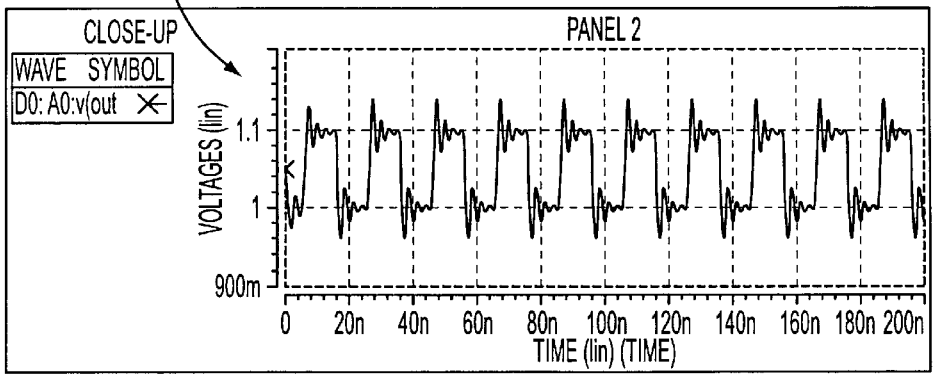
Figure 21C:
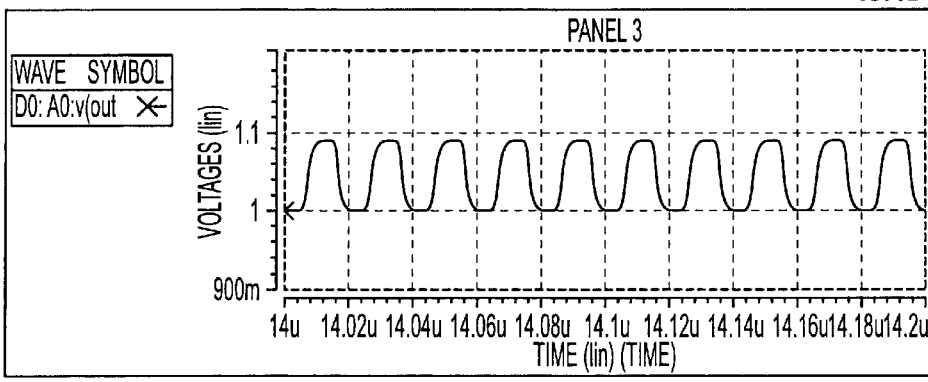
Figure 22D:
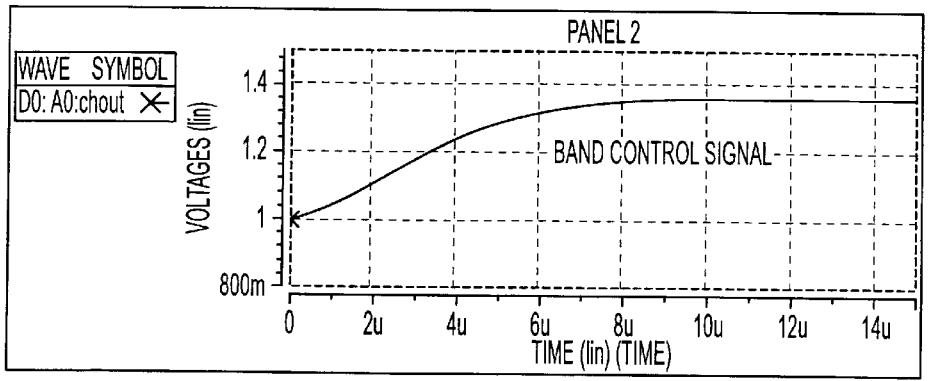
FIG. 22 shows an effect of the present invention corresponding to FIG. 3.
Figure 22A:
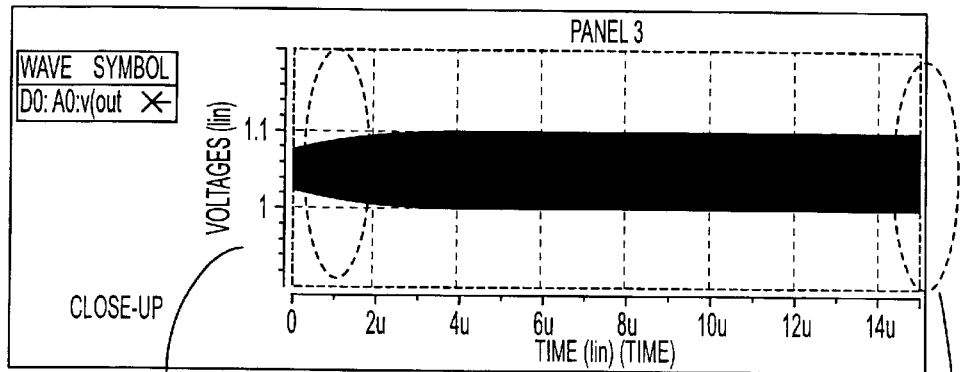
Figure 22B:
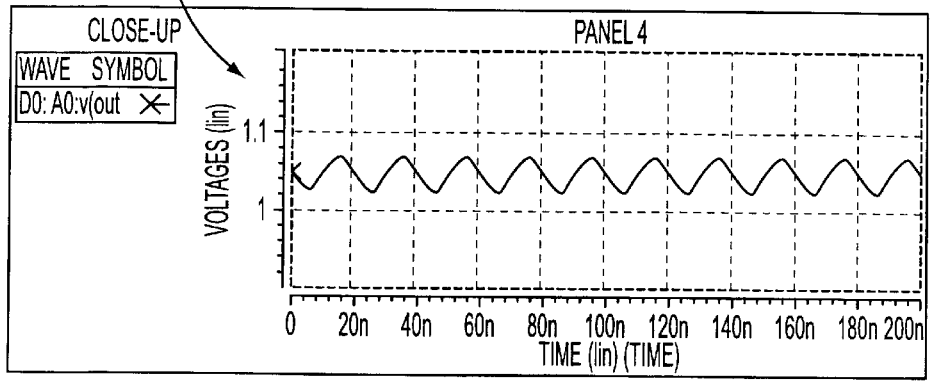
Figure 22C:
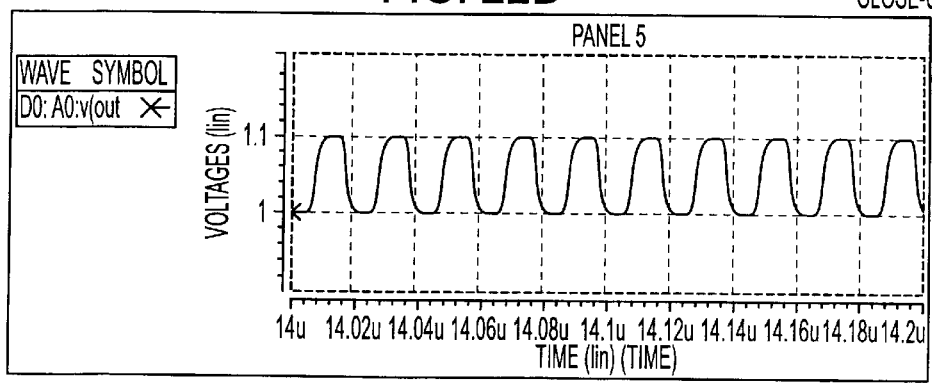

FIGS. 21D, 22D show two cases of a band control signal being output from band detection circuit 1. FIG. 21, which corresponds to FIG. 2, is a case of small input capacity of preamplifier 2 and a signal band becomes near the band of preamplifier 2. Therefore, a band control signal becomes large at an early period of measurement range period to feed back so as to control the band of preamplifier 2. Accordingly, a normal band range is obtained thereafter and the band control signal is settled at a constant level.

FIG. 22, which corresponds to FIG. 3, shows a case of large input capacity of preamplifier 2 resulting in shortage of the band. Therefore, the band control signal is small at an early period of the measurement range period to feed back so as to control the band of preamplifier 2. Accordingly, a normal band range is obtained thereafter and the band control signal is settled at a constant level.

APPLICATION FIELD IN THE INDUSTRY

As the present invention has been described, by employing the present invention, it becomes possible to cope with not only capacity dispersion existent in an input of a preamplifier in an optical reception circuit, but also dispersion of either a preamplifier gain or a feedback resistance.

Moreover, it becomes possible to retain a required band as well as to prevent oscillation even when an input capacity of the preamplifier is varied possibly caused by a capacity between the terminals of a light receiving diode PD or an implementation pattern, etc.

What is claimed is:

1. A preamplifier comprising:
   a variable gain amplifier connected to a light receiving element for converting a received light signal to electric current;
   a variable feedback resistor connected to an input and output of said variable gain amplifier; and
   a band detection circuit for detecting a signal band amplified by said variable gain amplifier,
   wherein a band control signal obtained from said band detection circuit controls the band of said variable gain amplifier.

2. The preamplifier according to claim 1,
   wherein said band detection circuit is connected to an output terminal of said variable gain amplifier to detect said amplified signal band directly from said variable gain amplifier output.

3. The preamplifier according to claim 1,
   wherein said band control signal controls said variable feedback resistor value.

4. The preamplifier according to claim 1,
   wherein said band control signal controls a gain of said variable gain amplifier.

5. The preamplifier according to claim 1 further comprising:
   an automatic gain control (AGC) circuit for controlling said variable gain amplifier output to a constant level,
   wherein said band detection circuit detects said amplified signal band from an output of said AGC circuit.

6. The preamplifier according to either one of claims 1 to 5,
   wherein said band detection circuit includes:
   a band detector; and
   a detection signal hold circuit for holding a detection signal obtained from said band detector.

7. The preamplifier according to claim 6,
   wherein said band detector includes:
   a level generation circuit for outputting two internally divided levels by resistance-dividing a bottom value and a peak value of a band detector input signal;
   a first comparator for comparing said band detector input signal with an upper level side of said two internally divided levels being output from said level generation circuit;
   a second comparator for comparing said band detector input signal with a lower level side of said two internally divided levels;
   a first delay circuit for delaying said second comparator output for a predetermined time; and
   a comparison circuit for comparing the timing of an output of said first delay circuit with the timing of said first comparator output.

8. The preamplifier according to claim 7, further comprising:
   a second delay circuit for delaying an output of said first delay circuit; and
   a mask circuit for masking an output of said comparison circuit using an output of said second delay circuit.

9. The preamplifier according to claim 8,
   wherein said comparison circuit includes:
   a first NAND gate which inputs said first delay circuit output and said first comparator output via a NOT circuit; and
   a second NAND gate which inputs said first delay circuit output via a NOT circuit and said second comparator output.

10. The preamplifier according to claim 9,
    wherein said mask circuit includes:
    a first mask circuit having a first NOR gate and an inverter connected to an output side of said first NOR gate, and in said first mask circuit one of the input terminals of said first NOR gate is connected to an output of said second delay circuit, while the other input terminal is connected to an output of said first NAND gate; and
    a second mask circuit having a second NOR gate, and in said second mask circuit one of the input terminals of said second NOR gate is connected to said second delay circuit output, while the other input terminal is connected to an output of said second NAND gate.

11. The preamplifier according to claim 10, further comprising a mask signal generation circuit connected to an output of said second mask circuit,
    wherein an output of said mask signal generation circuit is connected to the other input terminal of a NAND gate in said second mask circuit.

12. The preamplifier according to claim 11,
    wherein said mask signal generation circuit is constituted by a plurality of delay unit stages each consisting of a delay circuit and two-input OR gates connected to both input and output sides of said delay circuit.

13. The preamplifier according to claim 6,
    wherein said band detector includes:
    a level generation circuit for outputting two internally divided levels produced by resistance-dividing a bottom envelope value and a peak envelope value of a band detector input signal;
    a first comparator for comparing said band detector input signal with an upper level side of said two internally divided levels obtained from said level generation circuit;
    a second comparator for comparing said band detector input signal with a lower level side of said two internally divided levels;
    a first delay circuit for delaying said second comparator output for a predetermined time; and
    a comparator for comparing the timing of said first delay circuit output with the timing of said first comparator output.

14. The preamplifier according to claim 9,
wherein said detection signal hold circuit for holding a detection signal obtained from said band detector includes:
- a charge pump to which outputs of said first mask circuit and said second mask circuit are input; and
- a capacitor for charging an output of said charge pump.

15. The preamplifier according to claim 9,
wherein said detection signal hold circuit for holding a detection signal obtained from said band detector includes:
- an up-down counter for counting up or down corresponding to outputs of said first mask circuit and said second mask circuit; and
- a digital-to-analog converter for converting a count value of said up-down counter to an analog signal.

16. The preamplifier according to claim 15, further comprising:
a non-volatile memory connected between said up-down counter and a transistor in said digital-to-analog converter, and in said non-volatile memory an initial value to be used for adjustment is stored.

17. The preamplifier according to claim 1, further comprising a bitrate detector, the output terminal of which is connected to a bitrate signal input terminal of said band detection circuit.

18. The preamplifier according to claim 17,
wherein said bitrate detector detects a bitrate of said variable gain amplifier output.

19. The preamplifier according to claim 7 further comprising a bitrate detector, the output terminal of which is connected to a delay amount control terminal of said first delay circuit in said band detection circuit.

* * * * *